United States Patent [19]

Wang

[11] Patent Number: 5,943,566
[45] Date of Patent: Aug. 24, 1999

[54] METHOD OF FABRICATING A STATIC RANDOM ACCESS MEMORY

[75] Inventor: Jyh-Ming Wang, Hsinchu Hsien, Taiwan

[73] Assignee: United Semiconductor Corp., Hsinchu, Taiwan

[21] Appl. No.: 09/084,766

[22] Filed: May 26, 1998

[30] Foreign Application Priority Data

May 4, 1998 [TW] Taiwan .................................. 87106842

[51] Int. Cl.$^6$ .................... H01L 21/8234; H01L 21/8244
[52] U.S. Cl. .................. 438/238; 148/DIG. 163; 438/384; 438/382; 438/585; 438/591
[58] Field of Search ..................................... 438/384, 382, 438/383, 279, 275, 452, 238, 585, 587, 591; 48/DIG. 163; 257/380, 393, 904

[56] References Cited

U.S. PATENT DOCUMENTS

| | | |
|---|---|---|
| 4,984,200 | 1/1991 | Saitoo et al. . |
| 5,254,489 | 10/1993 | Nakata . |
| 5,285,096 | 2/1994 | Ando et al. . |
| 5,293,336 | 3/1994 | Ishii et al. . |
| 5,382,532 | 1/1995 | Kobayashi et al. . |
| 5,426,065 | 6/1995 | Chan et al. . |
| 5,502,009 | 3/1996 | Lin . |

*Primary Examiner*—Charles Bowers
*Assistant Examiner*—Scot J. Hawrarck
*Attorney, Agent, or Firm*—Christie, Parker & Hale, LLP

[57] ABSTRACT

After the formation of a gate oxide layer, a polysilicon layer is formed right away. The polysilicon layer is used for patterning the gate oxide layer. The photolithography and etching processes of forming the buried contact window are combined with the step of removing the gate oxide layer at the periphery circuit region. Then, after the formation of the gate oxide layer at the memory cell region, one thermal oxidation process is performed to form the gate oxide layer at the periphery circuit region.

10 Claims, 6 Drawing Sheets

METHOD OF FABRICATING A STATIC RANDOM ACCESS MEMORY

CROSS-REFERENCE TO RELATED APPLICATION

This application claims the priority benefit of Taiwan application serial no. 87106842, filed May 4, 1998, the full disclosure of which is incorporated herein by reference.

BACKGROUND OF THE INVENTION

1. Field of the Invention

The invention relates in general to the fabrication of a static random access memory (SRAM), and more particularly to a method of fabricating dual gate oxide and a buried contact of an SRAM.

2. Description of the Related Art

SRAM is the speediest semiconductor memory so that it is widely applied in, for example, accessing computer data. At present, SRAM is applied in digital equipment such as mini-computers and microprocessor and for storing system information.

Figure 1:
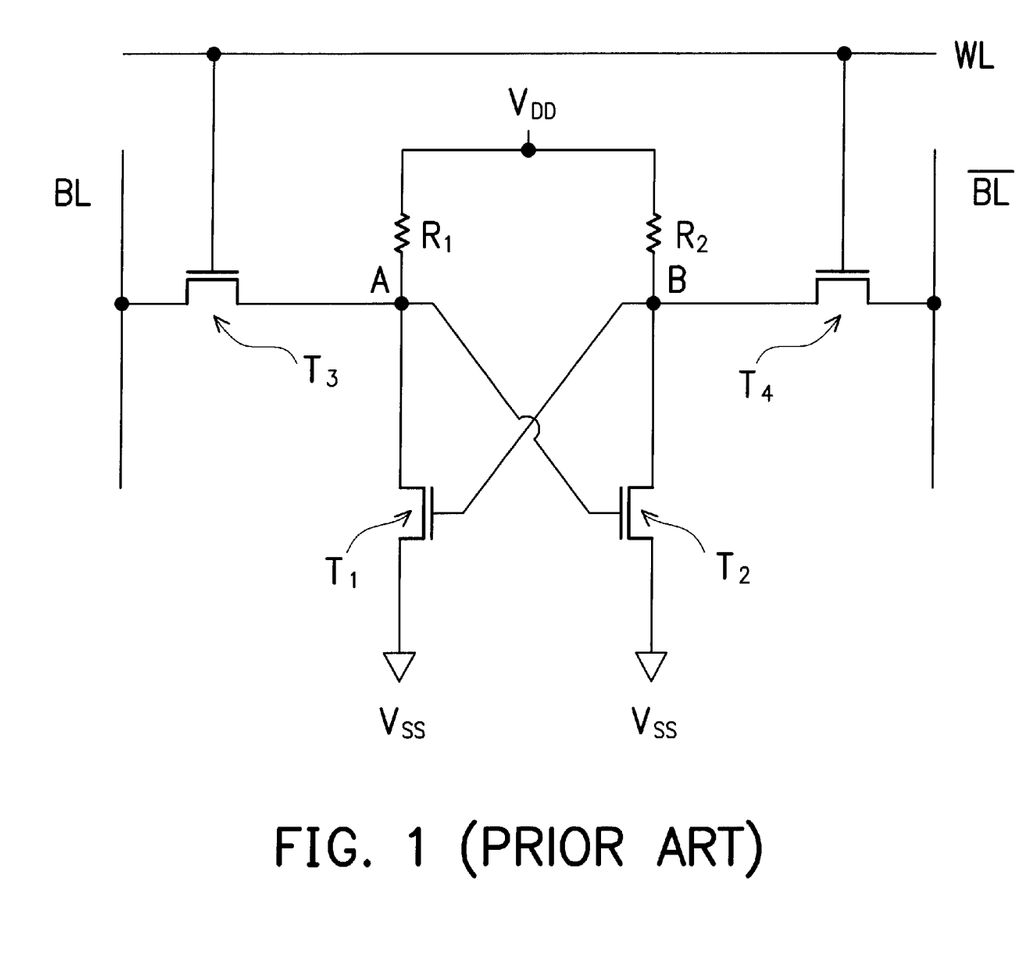
FIG. 1 is a circuit diagram of a single memory cell of a typical SRAM.

The structure of SRAM is basically divined into memory cell region and periphery circuit region. However, the operation voltage of these two regions is different and therefore the thickness of the gate oxide layer in these two regions is not equal. A single memory cell in the memory cell region is as shown in FIG. 1, which is used for storing data. The periphery circuit region includes numbers of address decoders for decoding the address of the memory cell in the memory cell region and some circuit foe memory operation.

For a typical SRAM, the structure of a single memory cell circuit is as shown in FIG. 1.

Referring to FIG. 1, a typically SRAM memory cell includes resistors $R_1$, $R_2$, and metal-oxide-semiconductor (MOS) transistors $T_1$, $T_2$, $T_3$, $T_4$. The resistor $R_1$ and the transistor $T_1$ are connected in serial. The drain region of the MOS transistor $T_1$ is coupled to the voltage source $V_{DD}$ and the source region is coupled to the grounding wire $V_{ss}$. The resistor $R_2$ and the MOS transistor $T_2$ are connected in serial. The drain region and the source region of the transistor $T_2$ are coupled to the voltage source $V_{DD}$ and the grounding wire $V_{ss}$, respectively.

Moreover, in the node A, there are the gate of the MOS transistor $T_2$ and the drain regions of the MOS transistor $T_1$ and the MOS transistor $T_3$ connected. In the node B, there are the gate of the MOS transistor $T_1$ and the drain regions of the MOS transistor $T_2$ and the MOS transistor $T_4$ connected. The gate electrodes of the MOS transistors $T_3$, $T_4$ are both couple to the word line WL. The source regions of the MOS transistors $T_3$, $T_4$ are coupled to the bit line BL and the complementary bit line $\overline{BL}$. The transistor T1 and the transistor T2 are used as drivers and the transistors T3 and the transistor T4 are used as access transistors for SRAM data access. The resistors R1 and R2 are used for loading.

Generally, node A and node B in FIG. 1 are contact window structure. These contact windows are mostly formed above the source/drain regions. For some high integration integrated circuit (IC), this kind of contact window is not satisfied. Therefore, a buried contact for local interconnection is proposed. The buried contact uses less surface area of the wafer. For example, as the buried contact is applied in SRAM, 25% less of surface area is used. Therefore, the buried contact provides high-density devices fairy high efficiency.

FIG. 2A to FIG. 2G illustrates a fabrication method of dual gate oxide and a buried contact of a convention SRAM. The operation voltage of the memory cell region and the periphery circuit region is not equal and therefore the thickness of the gate oxide layer is not the same. The buried contact is connected to a gate electrode of a MOS transistor and drain regions of two MOS transistors.

Figure 2A:
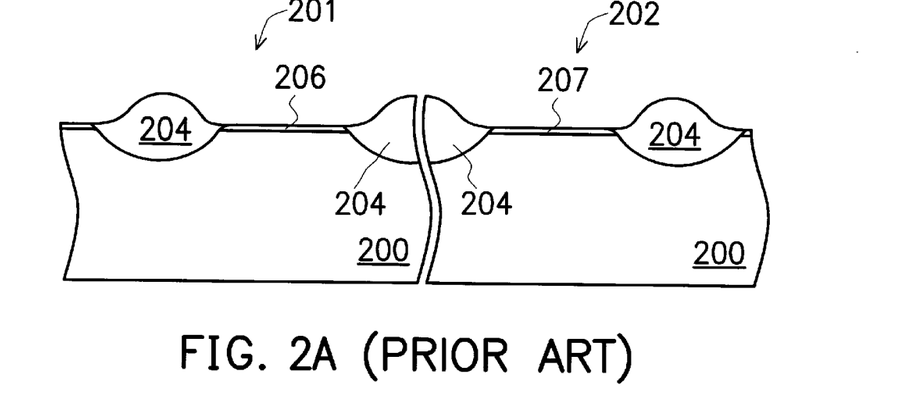
FIG. 2A to FIG. 2G are cross-section views showing the process of fabricating a dual gate oxide layer and a buried contact window of a conventional SRAM.

Referring to FIG. 2A, on a semiconductor substrate 200, a device isolation structure, such as field oxide 204 is formed. The semiconductor substrate 200 includes a memory cell region 201 and a periphery circuit region 202. The memory cell region 201 is for forming SRAM memory cells and the periphery circuit region 202 includes address decoders and circuits related to memory operation. Address decoders are used for decoding the address of the memory cells at the memory cell region 201.

Then, processes for forming gate oxide is performed. The gate oxide layer of the periphery circuit region 202 of SRAM is formed in two stages. First, a gate oxide layer 206 is first formed on the memory cell region 201 at the surface of semiconductor substrate 200. A gate oxide layer 207 is simultaneously formed on the periphery circuit region. The gate oxide layers are formed by thermal oxidation and have a thickness of about 95 Å.

Figure 2B:
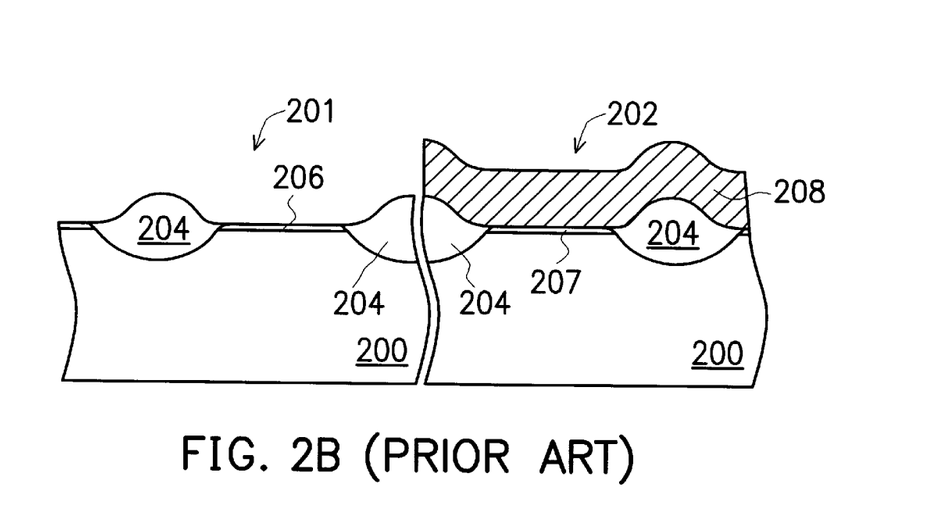

Next, referring to FIG. 2B, a photoresist layer 208 is formed to cover the periphery circuit region 202 to cover the gate oxide layer 207 at the periphery circuit region 202.

Figure 2C:
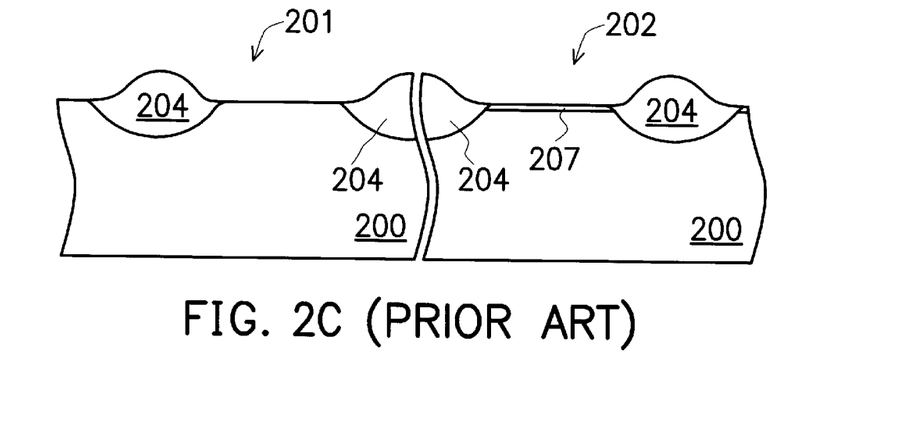

Next, referring to FIG. 2C, the gate oxide layer 206 is removed from the memory cell region 201. The photoresist layer 208 is then removed so that the gate oxide layer 207 on the periphery circuit region 202 is exposed.

However, using the photoresist layer 208 to cover the gate oxide layer 207 on the periphery circuit region 202 influences the quality of the gate oxide layer 207 and causes the problem of incomplete removing of the photoresist layer 208.

Figure 2D:
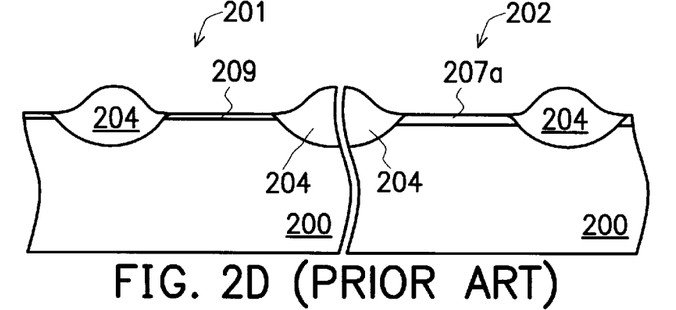

Next, referring to FIG. 2D, a second stage of forming the gate oxide layer is performed. On the memory cell region 201 of the semiconductor substrate 200, a gate oxide layer 209 is formed by thermal oxidation. The gate oxide layer 209 has a thickness of about 65 Å. Simultaneously, the gate oxide layer 207 at the periphery circuit region 202 is continuously oxidized. The gate oxide layer 207 becomes a gate oxide layer 207a, having a thickness of about 120 Å. Consequently, the dual gate oxide layer is formed. The gate oxide layer 209 at the memory cell region 201 has a thickness of about 65 Å and the gate oxide layer 207a at the periphery circuit region 202 has a thickness of about 120 Å.

The gate oxide layer 207a at the periphery circuit region 202 is formed in two stages. First, a gate oxide layer 207 having a thickness of 95 Å is formed. Secondly, the gate oxide layer 207 is further oxidized to have a thickness of about 120 Å to become a gate oxide layer 207a. The thickness of the gate oxide layer 207a can not be precisely controlled and the quality is not reliable since the gate oxide layer 207a is formed by two stages.

Figure 2E:
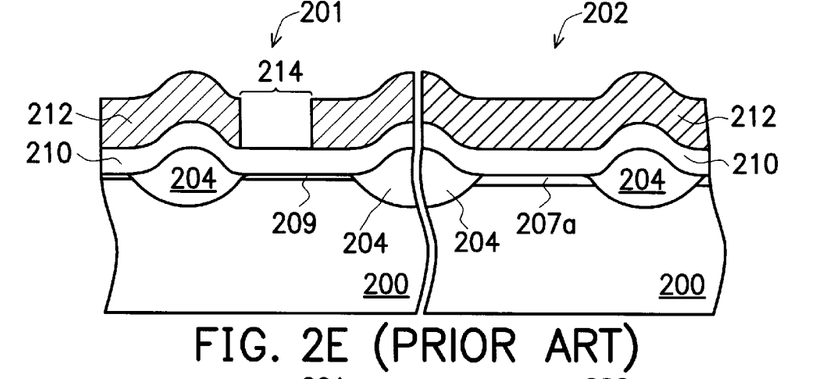

Referring to FIG. 2E, a conductive layer 210 is formed over the whole semiconductor substrate 200. The material of the conductive layer 210 can be, for example, doped polysilicon. On the conductive layer 210, a photoresist layer 212 with a pattern of buried contact region 214 is formed. The buried contact window region 214 is located at the memory cell region 214 and connects the gate of one MOS transistor and the drain regions of two MOS transistors.

Figure 2F:
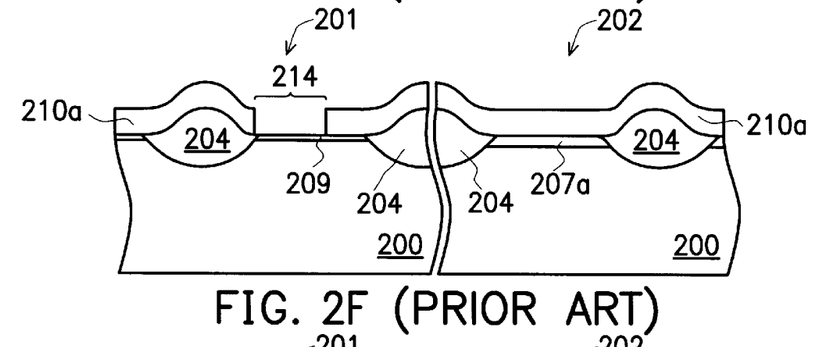

Next, referring to FIG. 2F, using the photoresist layer 212 as an etching mask, the conductive layer 210 is etched to form a conductive layer 210a so that the gate oxide layer 209 at the contact window region 214 is exposed. The photoresist layer 212 is then stripped.

Figure 2G:
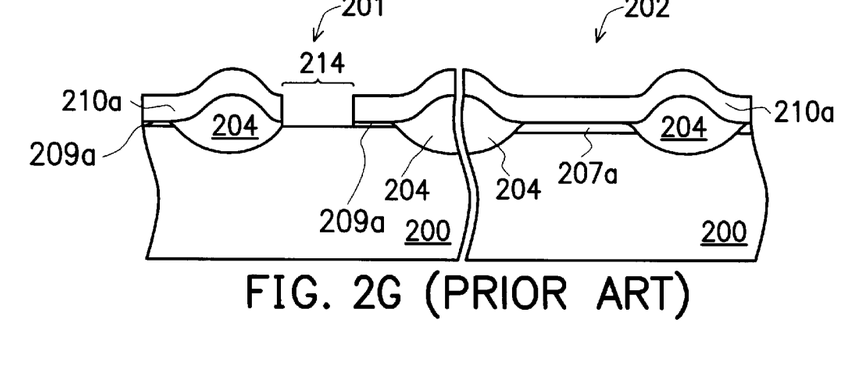

Next, referring to FIG. 2G, using the conductive layer 210a as a mask, a portion of the gate oxide layer 209 is stripped so that the surface of the semiconductor substrate 200 is exposed. The remained gate oxide layer at the memory cell region 201 is resented as a gate oxide layer 209a.

The sequential processes are then continued to complete the SRAM.

SUMMARY OF THE INVENTION

It is therefore an object of the invention to provide a method of fabricating a dual gate oxide layer of a SRAM to prevent the gate oxide layer from the contamination of the photo resist layer.

It is another subject of the invention to provide a method of fabricating a dual gate oxide layer of a SRAM which forms the gate oxide layer of the periphery circuit region in one stage. Therefore, the thickness and the quality of the gate oxide layer of the periphery circuit region are easier to be controlled.

The invention achieves the above-identified objects by providing a method including the following steps. After the formation of a gate oxide layer, a polysilicon layer is formed right away. The polysilicon layer is used for patterning the gate oxide layer. The photolithography and etching processes of forming the buried contact window are combined with the step of removing the gate oxide layer at the periphery circuit region. Then, after the formation of the gate oxide layer at the memory cell region, one thermal oxidation process is performed to form the gate oxide layer at the periphery circuit region.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

FIG. 3A to FIG. 3I show the process of fabricating a dual gate oxide layer and a buried contact window of a SRAM according to a preferred embodiment of the invention. The operation voltage of the memory cell region and the periphery circuit region of an SRAM is different and the thickness of the gate oxide layer is different. The buried contact window connects a gate electrode of one MOS transistor and drain regions of two MOS transistors.

Figure 3A:
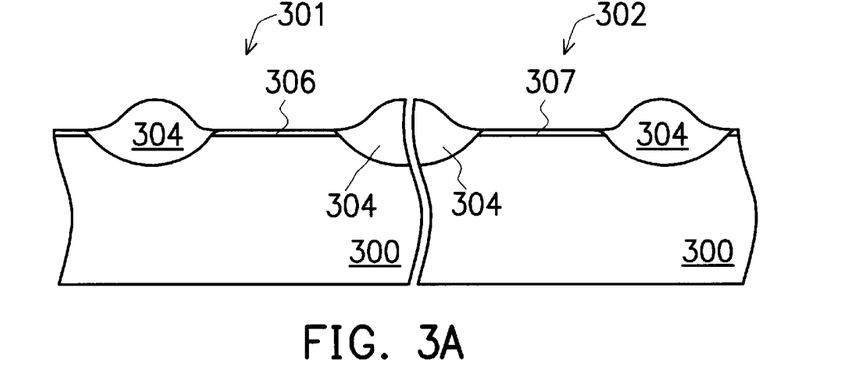
FIG. 3A to FIG. 3I are cross-section views showing the process of fabricating a dual gate oxide layer and a buried contact window of a SRAM according to a preferred embodiment of the invention.

Referring first to FIG. 3A, on a substrate 300, a device isolation structure is formed. The device isolation structure can be, for example, field oxide 304. The device isolation structure defines the active region, which includes a memory cell region 301 and a periphery circuit region 302. The memory cell region 301 is for forming SRAM memory cells. At the periphery circuit region 302, there are address decoders for decoding the address of the memory cell and some related circuit for memory operation.

A gate oxide layer 306 is then formed on the memory cell region 301 at the semiconductor substrate 300. Simultaneously, a gate oxide layer 307 is formed. The method of forming gate oxide layers can be thermal oxidation and the oxide layers 306, 307 have a thickness of about 65 Å.

Figure 3B:
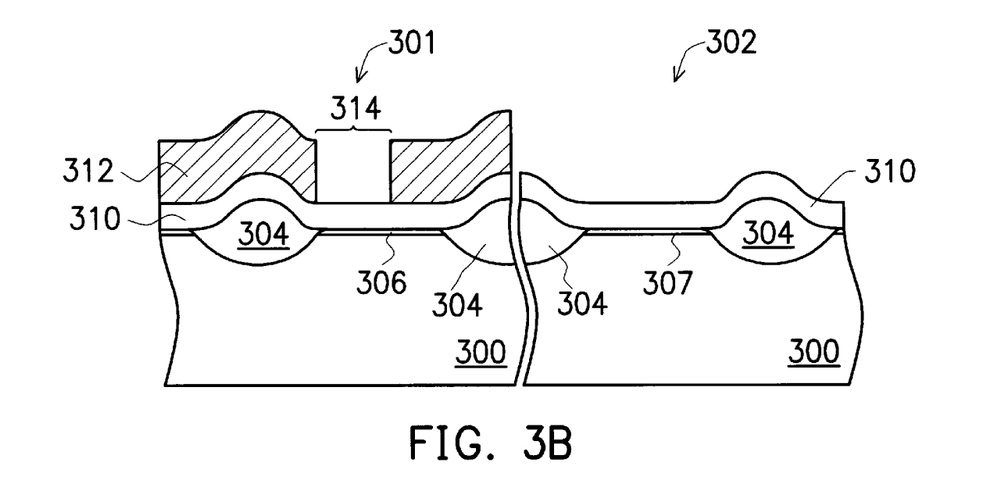

Referring to FIG. 3B, a conductive layer 310 and a photoresist layer are successively formed over the whole semiconductor substrate 300. The photoresist layer on the periphery circuit region 302 and the buried contact window region 314 is stripped to form a photoresist layer 312. The material of the conductive layer 310 is preferably doped polysilicon.

It is one of the characters of the invention that a conductive layer 310 is formed over the gate oxide layer 306 and the gate oxide layer 307 right after the formation of the gate oxide layer 306 and the gate oxide layer 307. The conductive layer is used for preventing the gate oxide layer 306 and the gate oxide layer 307 from direct contacting with the photoresist layer so that the quality of the gate oxide layer 306 and the gate oxide layer 307 can be well controlled.

Figure 3C:
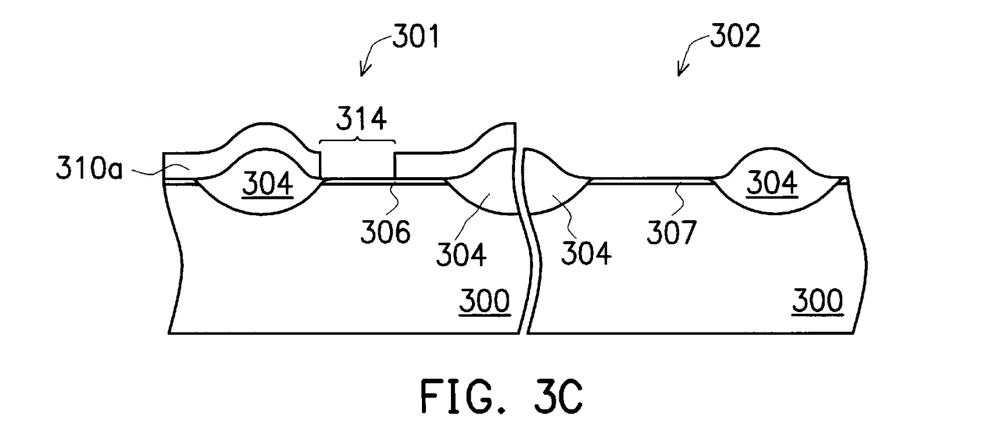

Next, referring to FIG. 3C, the photoresist layer 312 is used as an etching mask to etch the conductive layer 310 so that the conductive layer 310 becomes the conductive layer 310a. The conductive layer 310a exposes the gate oxide layer 307 at the periphery circuit region 302 and the gate oxide layer 306 at the buried contact window region 314 of the memory cell region 301. The photoresist layer 312 is then stripped.

Figure 3D:
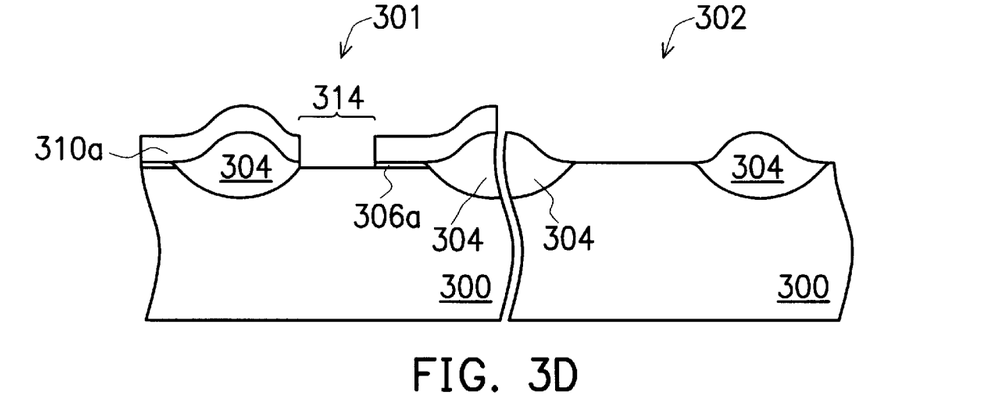

Next, referring to FIG. 3D, using the conductive layer 310a as an etching mask, a portion of the gate oxide layer 306 at the buried contact window 314 of the memory cell region 301 is stripped so that the gate oxide layer 306 becomes a gate oxide layer 306a. The gate oxide layer 307 at the periphery circuit region 302 is stripped to expose the surface of the semiconductor substrate 300. Consequently, the gate oxide layer 306a, having a thickness of about 65 Å, at the gate oxide layer 306a is formed.

It is another character of the invention that the conductive layer 310a, but not the conventional photoresist layer, is used as an etching mask to define the gate oxide layer. Therefore, the problem of photoresist residue on the surface of the gate oxide layer is overcome and the quality of the gate oxide layer is increased.

Also, the invention combines the photolithography and etching process of forming the buried contact window and the step of removing the gate oxide layer 307 at the periphery circuit region 302 in one step so that less mask is used than the conventional method.

Figure 3E:
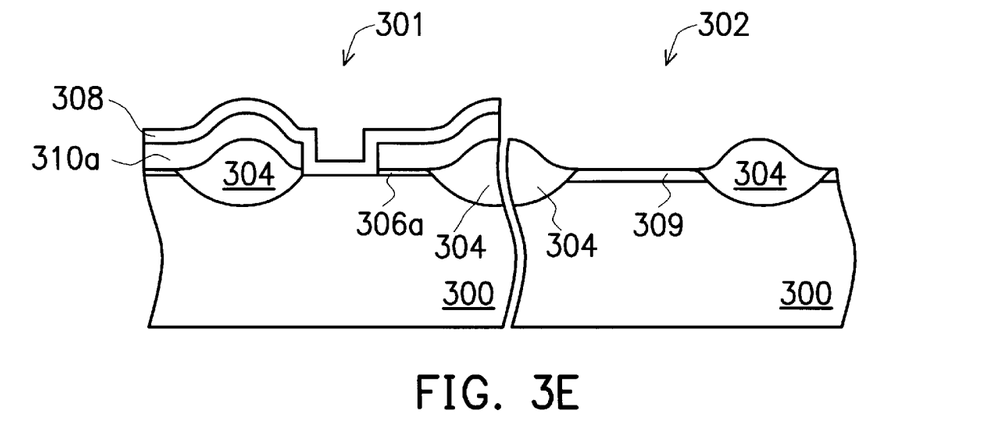

Next, referring to FIG. 3E, an oxide layer is formed over the whole semiconductor substrate 300. The oxide layer can be formed by thermal oxidation and has a thickness of about 120 Å. The oxide layer at the memory cell region 301 is represented as an oxide layer 308. The oxide layer 308 covers the surface of the conductive layer 310a and the exposed surface of semiconductor substrate 300 at the buried contact window region 314. The oxide layer at the periphery circuit region 302 is the gate oxide layer 309. The gate oxide layer 309 has a thickness of about 120 Å.

It is therefore another character of the invention that the gate oxide layer 309 at the periphery circuit region 302 can be formed in one step, which is different from the conventional two-step process. Therefore, the thickness of the gate oxide layer 309 at the periphery circuit region 302 can be precisely controlled and the quality of the gate oxide layer 309 in increased.

Figure 3F:
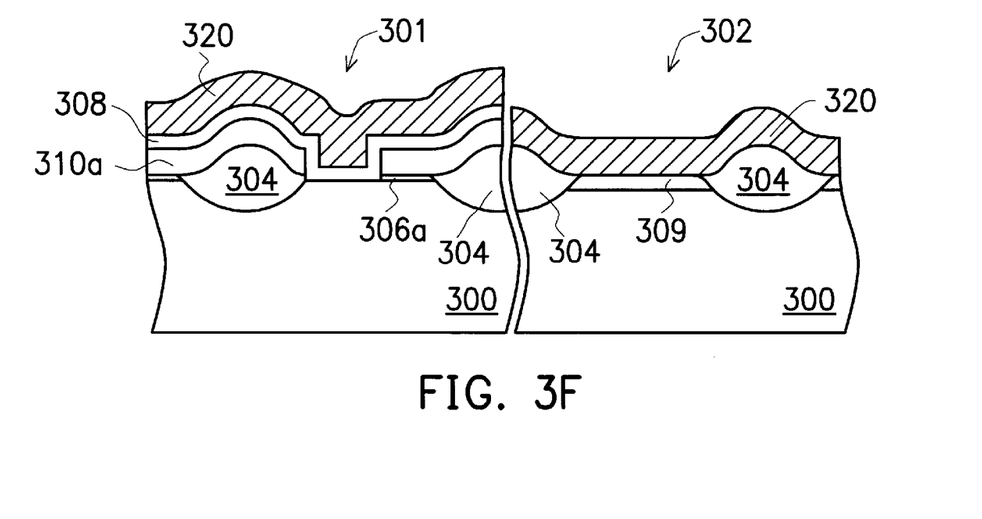

Next, referring to FIG. 3F, a conductive layer 320 is formed over the whole semiconductor substrate 300. The material of the conductive layer 320 can be, for example, doped polysilicon.

Figure 3G:
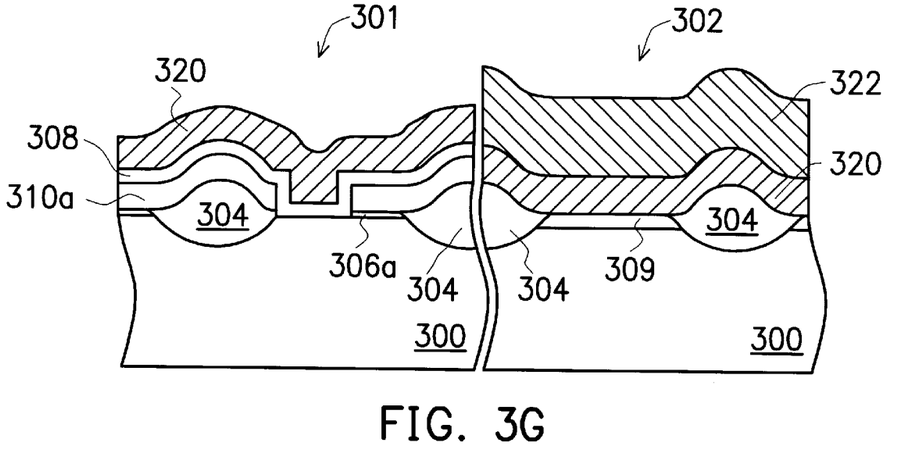

Next, referring to FIG. 3G, a photoresist layer 322 is formed to cover the conductive layer 320 at the periphery circuit region 302 by photolithography.

Figure 3H:
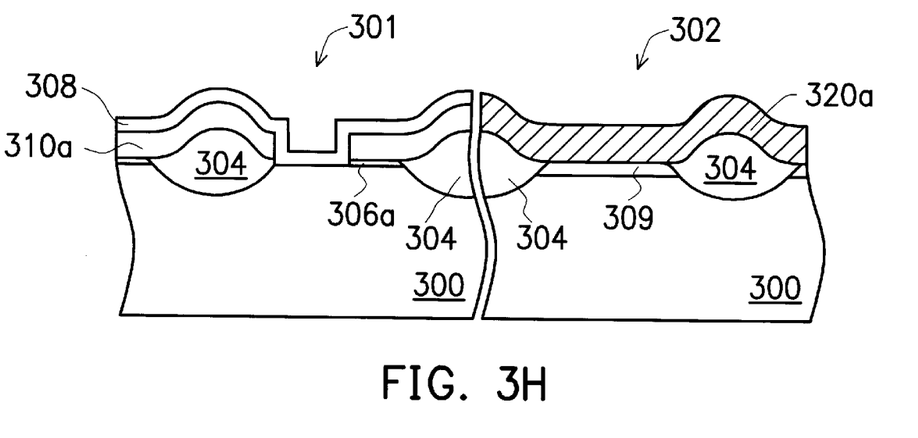

Referring to FIG. 3H, the photoresist layer 322 is used as an etching mask to etch the conductive layer 320. In other words, the conductive layer 320 at the memory cell region 301 is removed until the oxide layer 308 at the memory cell region 301 is exposed and the conductive layer 320 becomes a conductive layer 320a. Then, the photoresist layer 322 is stripped.

Figure 3I:
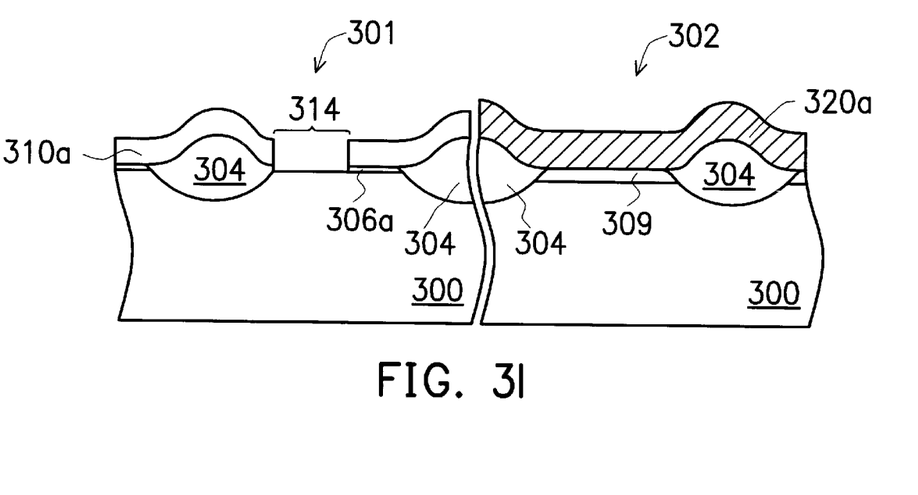

Referring to FIG. 3I, using the conductive layer 320a as a mask, the oxide layer 308 is stripped so that the conductive layer 310a at the memory cell region 301 and the surface of the semiconductor substrate 300 at the buried contact region 314 are exposed.

No extra photolithography process is taken than the conventional during performing the method of the invention.

Then, sequential SRAM processes are performed. These sequential processes are not directly related to the invention so that are not further described.

The characters of the invention include:

(1) The conductive layer is formed over the gate oxide layers after their formation. The conductive layer is used for preventing the gate oxide layers from direct contacting with the photoresist layer so that the quality of the gate oxide layers can be well controlled.

(2) The conductive layer, but not the conventional photoresist layer, is used as an etching mask to define the gate oxide layer. Therefore, the problem of photoresist residue on the surface of the gate oxide layer is overcome and the quality of the gate oxide layer is increased.

(3) The invention combines the photolithography and etching process of forming the buried contact window and the step of removing the gate oxide layer at the periphery circuit region in one step so that less mask is used than the conventional method.

(4) The gate oxide layer at the periphery circuit region can be formed in one step, which is different from the conventional two-step process. Therefore, the thickness of the gate oxide layer at the periphery circuit region can be precisely controlled and the quality of the gate oxide layer in increased.

(5) No extra photolithography process is taken than the conventional during performing the method of the invention.

What is claimed is:

1. A method of forming a static random access memory (SRAM), comprising:

providing a semiconductor substrate, wherein there is a device isolation region formed on the semiconductor substrate and wherein the semiconductor substrate includes a memory cell region and a periphery circuit region;

forming a first oxide layer and a first conductive layer successively on the semiconductor substrate;

patterning the first conductive layer until a buried contact at the memory cell region and the first oxide layer at the periphery circuit region are exposed;

removing the first oxide layer on the buried contact window region at the memory cell region and the first oxide layer at the periphery circuit region;

forming a second oxide layer and a second conductive layer successively to cover the memory cell region and the periphery circuit region;

patterning the second conductive layer until the second oxide layer at the memory cell region is exposed so that the second conductive layer covers only the periphery circuit region; and removing the second oxide layer at the memory cell region until the first conductive layer and a surface of the semiconductor substrate at the buried contact window region are exposed; wherein the first oxide layer at the memory cell region and the second oxide layer at the periphery circuit region together form a dual gate oxide layer of the SRAM.

2. A method according to claim 1, wherein the first oxide layer has a thickness of about 65 Å.

3. A method according to claim 1, wherein the first conductive layer comprises doped polysilicon.

4. A method according to claim 1, wherein the second oxide layer has a thickness of about 120 Å.

5. A method according to claim 1, wherein the second conductive layer comprises doped polysilicon.

6. A method of forming a static random access memory (SRAM), comprising:

providing a semiconductor substrate, wherein there is a device isolation region formed on the semiconductor substrate and wherein the semiconductor substrate includes a memory cell region and a periphery circuit region;

forming a first oxide layer, a first conductive layer and a first photoresist layer successively on the semiconductor substrate, wherein the first photoresist layer has a pattern of a buried contact window region and the periphery circuit region;

using the first photoresist layer as a mask to pattern the first conductive layer until the buried contact window region at the memory cell region and the first oxide layer at the periphery circuit region are exposed;

removing the first photoresist layer;

removing the first oxide layer on the buried contact window region at the memory cell region and the first oxide layer at the periphery circuit region;

forming a second oxide layer, a second conductive layer and a second photoresist layer successively to cover the memory cell region and the periphery circuit region; wherein the second photoresist layer has a pattern of the memory cell region;

using the second photoresist layer as a mask to pattern the second conductive layer until the second oxide layer at the memory cell region is exposed so that the second conductive layer covers only the periphery circuit region;

removing the second photoresist layer; and removing the second oxide layer at the memory cell region until the first conductive layer and a surface of the semiconductor substrate at the buried contact window region are exposed; wherein the first oxide layer at the memory cell region and the second oxide layer at the periphery circuit region together form a dual gate oxide layer of the SRAM.

7. A method according to claim 6, wherein the first oxide layer has a thickness of about 65 Å.

8. A method according to claim 6, wherein the first conductive layer comprises doped polysilicon.

9. A method according to claim 6, wherein the second oxide layer has a thickness of about 120 Å.

10. A method according to claim 6, wherein the second conductive layer comprises doped polysilicon.

* * * * *